(12) United States Patent
Chung et al.

(10) Patent No.: US 7,688,613 B2
(45) Date of Patent: Mar. 30, 2010

(54) METHOD AND SYSTEM FOR CONTROLLING MULTIPLE ELECTRICAL FUSES WITH ONE PROGRAM DEVICE

(75) Inventors: Shine Chung, Taipei Hsien (TW); Yung-Lung Lin, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 431 days.

(21) Appl. No.: 11/735,454

(22) Filed: Apr. 14, 2007

(65) Prior Publication Data

US 2008/0251884 A1 Oct. 16, 2008

(51) Int. Cl.
G11C 17/00 (2006.01)
G11C 5/06 (2006.01)
G11C 7/10 (2006.01)
G11C 17/18 (2006.01)

(52) U.S. Cl. ...................... 365/96; 365/72; 365/189.02; 365/225.7

(58) Field of Classification Search .................. 365/72, 365/96, 105, 189.02, 225.7
See application file for complete search history.

(56) References Cited

U.S. PATENT DOCUMENTS

| 6,525,953 | B1 * | 2/2003 | Johnson ........................ 365/63 |
| 6,646,912 | B2 * | 11/2003 | Hurst et al. .................. 365/175 |
| 2003/0107917 | A1 * | 6/2003 | Eaton, Jr. .................... 365/175 |

* cited by examiner

*Primary Examiner*—Ly D Pham
(74) *Attorney, Agent, or Firm*—K&L Gates LLP

(57) ABSTRACT

A fuse circuit comprising one or more one-time programmable electrical fuses; one or more unidirectional conductive devices each coupled to one of the fuses; a programming device coupled to the unidirectional conductive devices; and a selection module coupled to the electrical fuses for selecting a predetermined electrical fuse, wherein upon a selection by the selection module, a programming current is introduced through at least one selected electrical fuse, wherein the selection module is an N-to-one multiplexer selecting one of the N number of electrical fuses to be programmed, and the unidirectional conductive devices not coupled to the selected electrical fuse to prevent the programming current from interfering with the remaining electrical fuses.

18 Claims, 6 Drawing Sheets

METHOD AND SYSTEM FOR CONTROLLING MULTIPLE ELECTRICAL FUSES WITH ONE PROGRAM DEVICE

BACKGROUND

The present invention relates generally to integrated circuit designs, and more particularly to methods and systems for implementing multiple electrical fuses in a fuse cell equipped with only one programming device.

Electrical fuses are often utilized for modern semiconductors. Typically, they are designed to blow when a current through the fuses exceeds a pre-determined threshold. When the fuses are programmed or "blown", although not necessarily physically broken, they enter into a high impedance state. Electrical fuses are commonly used for making adjustments and repairs that are performed as late as after the chip is packaged. Since wirings are allowed at the two ends of the fuses, the fuses can be flexibly positioned within the chip, which is much more desirable than the conventional laser fuses as it is impossible to implement many metal layers or thick dielectrics above the laser fuses. This flexibility makes electrical fuses a desirable component for higher density memory devices.

However, conventional methods of programming electrical fuses in a memory device are not very efficient in utilizing precious silicon areas and thus are costly. For example, conventional methods for programming an electrical fuse require that one programming device is assigned for each fuse. In order to program an electrical fuse, a large supply current is necessary to be directed through the fuse. In order to provide this large supply current, programming devices attached to the fuses are very large. As the number of electrical fuses increase, the number of these large programming devices also increases FIG. 1A presents a schematic diagram 102 showing how an electrical fuse is programmed using a NMOS programming device, while FIG. 1B presents a schematic diagram 104 showing how an electrical fuse is programmed using a PMOS programming device. In the schematic diagram 102, an electrical fuse 106 is placed between a NMOS programming device 108 and a high voltage source VDDQ. In the schematic diagram 104, a PMOS programming device 110 is placed between an electrical fuse 112 and a high voltage source VDDQ. A "Select" control signal enters through either a select line 114 or a select line 116, when either the electrical fuse 106 or 112 is assigned to be programmed.

The programming devices 108 and 110 are large in physical size since large currents are required to program electrical fuses, such as the electrical fuses 106 and 112. The conventional method of programming electrical fuses requires one program device for each fuse. This method is extremely inefficient and costly since each fuse requires a separate programming device. In a large array of fuses, the large programming devices will take up massive areas within a silicon environment.

It is always desirable to provide an improved programming mechanism with multiple fuses to improve silicon area utilization without causing deterioration to operational performance.

SUMMARY

The present disclosure provides for a fuse circuit comprising one or more one-time programmable electrical fuses; one or more unidirectional conductive devices each coupled to one of the fuses; a programming device coupled to the unidirectional conductive devices; and a selection module coupled to the electrical fuses for selecting a predetermined electrical fuse, wherein upon a selection by the selection module, a programming current is introduced through at least one selected electrical fuse, wherein the selection module is an N-to-one multiplexer selecting one of the N number of electrical fuses to be programmed, and the unidirectional conductive devices not coupled to the selected electrical fuse prevent the programming current from interfering with the remaining electrical fuses.

The construction and method of operation of the invention, however, together with additional objectives and advantages thereof will be best understood from the following description of specific embodiments when read in connection with the accompanying drawings.

DESCRIPTION

Figure 1:
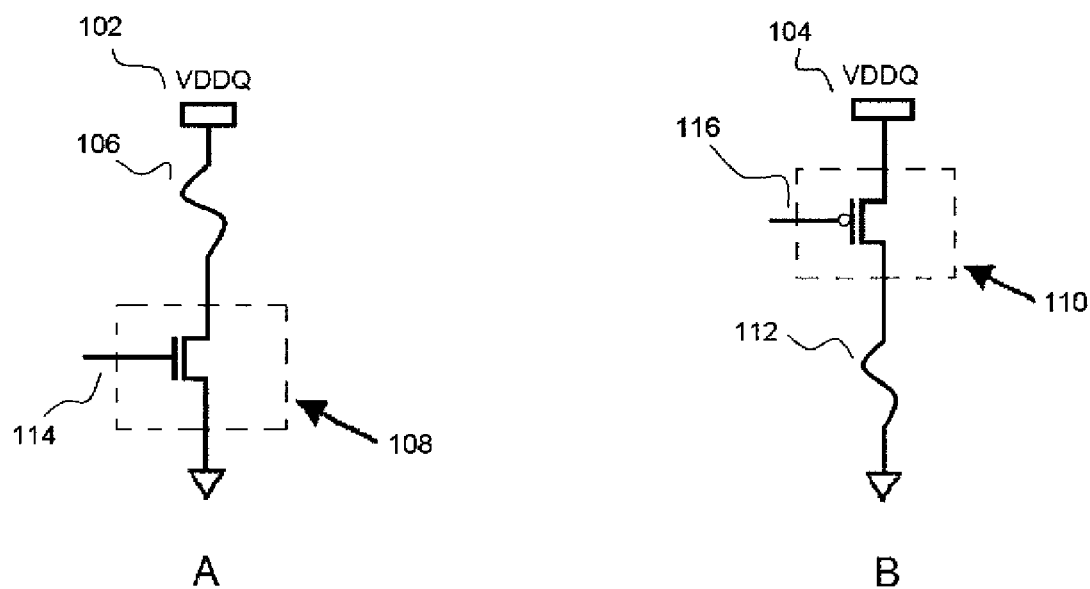
FIGS. 1A and 1B illustrate two schematic drawings showing conventional fuse cell programming methods.

Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2:
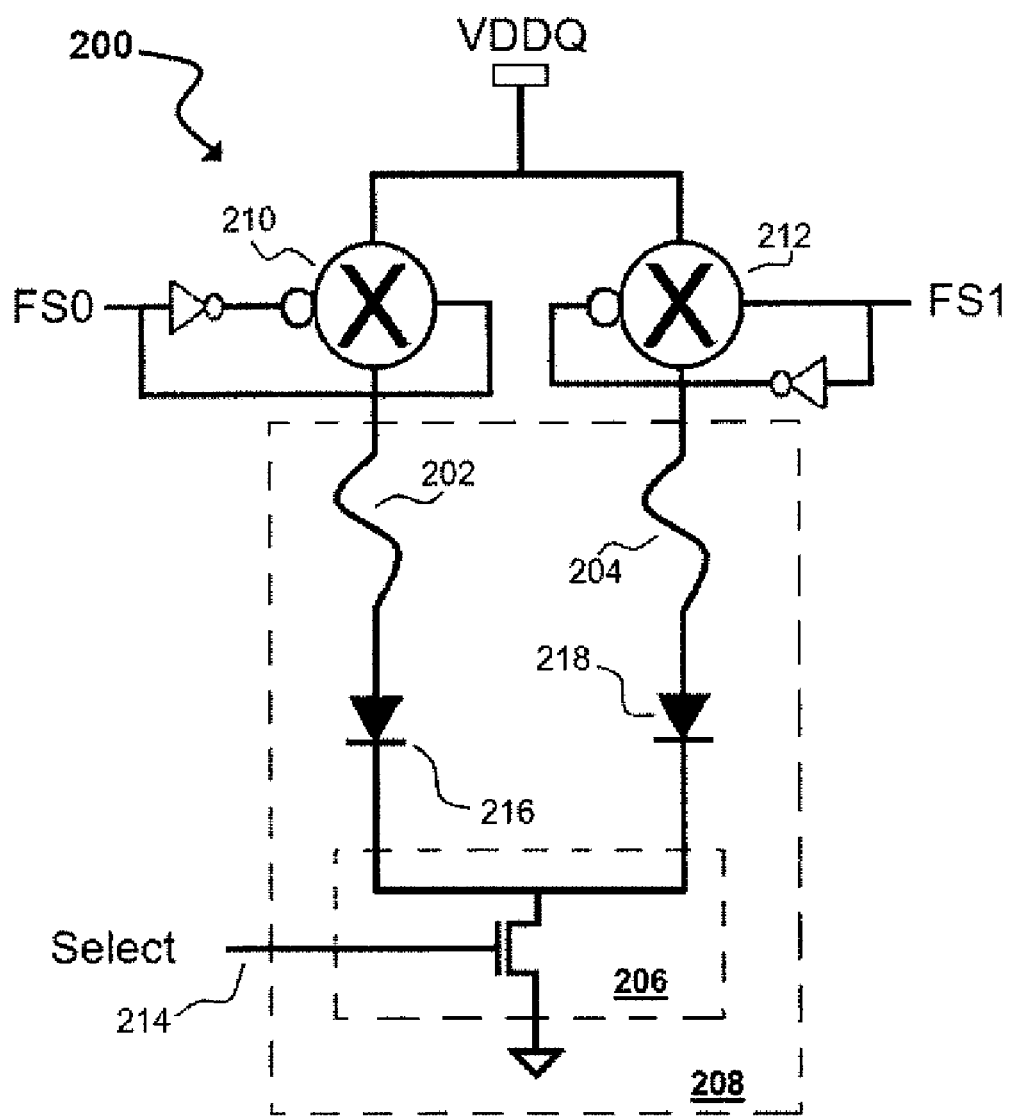
FIG. 2 illustrates a schematic for programming a fuse cell in accordance with one embodiment of the current invention.

FIG. 2 presents a schematic diagram 200 showing how two electrical fuses 202 and 204, and diodes 216 and 218, share a single programming device 206 within a fuse cell 208 in accordance with the first embodiment of the present invention. Both electrical fuses 202 and 204 are connected to a high voltage source VDDQ through a selection module such as multiplexers 210 and 212, respectively. In this example, the fuses are coupled to the programming device 206 through diodes 216 and 218. In this example the programming device 206 is coupled between the fuses 202 and 204 and a complementary power supply such as a ground or VSS. When the electrical fuse 202 or 204 needs to be programmed, a programming selection signal will enter through a "Select" line 214, commanding the programming device 206 to program one of the electrical fuses. Control signals coming in through the fuse select lines such as the two fuse selection signals FS0 and FS1 will enter the multiplexers 210 and 212 to turn on one of the multiplexers, thereby allowing one of the electrical fuses to be programmed.

For example, if the electrical fuse 202 needs to be programmed, the high voltage source VDDQ will rise in order to provide enough current to break the electrical fuse 202. The control signal will enter the programming device 206 through the "Select" line 214 and command it to program the electrical fuse 202 by turning on, in this example, the NMOS transistor within the programming device 206. Incoming signals will also appear at the fuse select line FS0, which commands the multiplexer 210 to turn on. This opens up a path for the high voltage source VDDQ to provide the current necessary to program the electrical fuse 202. The diode 218 operates to keep the fuse programming current from interfering with electrical fuse 204, or when a plurality of cells 208 are put into an array and share the same multiplexers 210 and 212.

While programming device 206 is shown to be a single NMOS device, it is nevertheless understood by those skilled in the art that the programming device 206 may have other NMOS-type or PMOS-type configurations. Also those skilled in the art will recognize that the diodes 216 and 218 can be any unidirectional current device such as NMOS-type or PMOS-type semiconductors having their gates connected to their drains such that they only allow a current to flow in a single direction. Also combinations of zero-Vt, or low Vt MOS-type devices may be used to cause the same unidirectional current operation.

In addition, the multiplexers 210 and 212 may also be NMOS-type, PMOS-type, or CMOS-type, without deviating from the spirit of this invention. In fact, the multiplexers 210 and 212 can be combined into one multiplexer in this embodiment with the fuse selection signal FS0 and FS1 complementary to each other so that the programming current is either passing through the fuse 202 or 204 at any round of programming. In essence, the function of the selection module is to allow VDDQ to be coupled to one and only one predetermined fuse at any particular round of programming. To meet this need, the selection module is essentially an N-to-one multiplexer where "N" is the total number of fuses in the fuse cell. In the simplest example, each fuse is controlled by one fuse selection signal and one multiplexer.

References in the specification to "one embodiment", "an embodiment", "an example embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure or characteristic is described in connection with an embodiment, it is submitted that it is within the knowledge of one of ordinary skill in the arts to affect such feature, structure or characteristic in connection with other embodiments whether or not explicitly described. Parts of the description are presented using terminology commonly employed by those of ordinary skill in the art to convey the substance of their work to others of ordinary skill in the arts.

Figure 3:
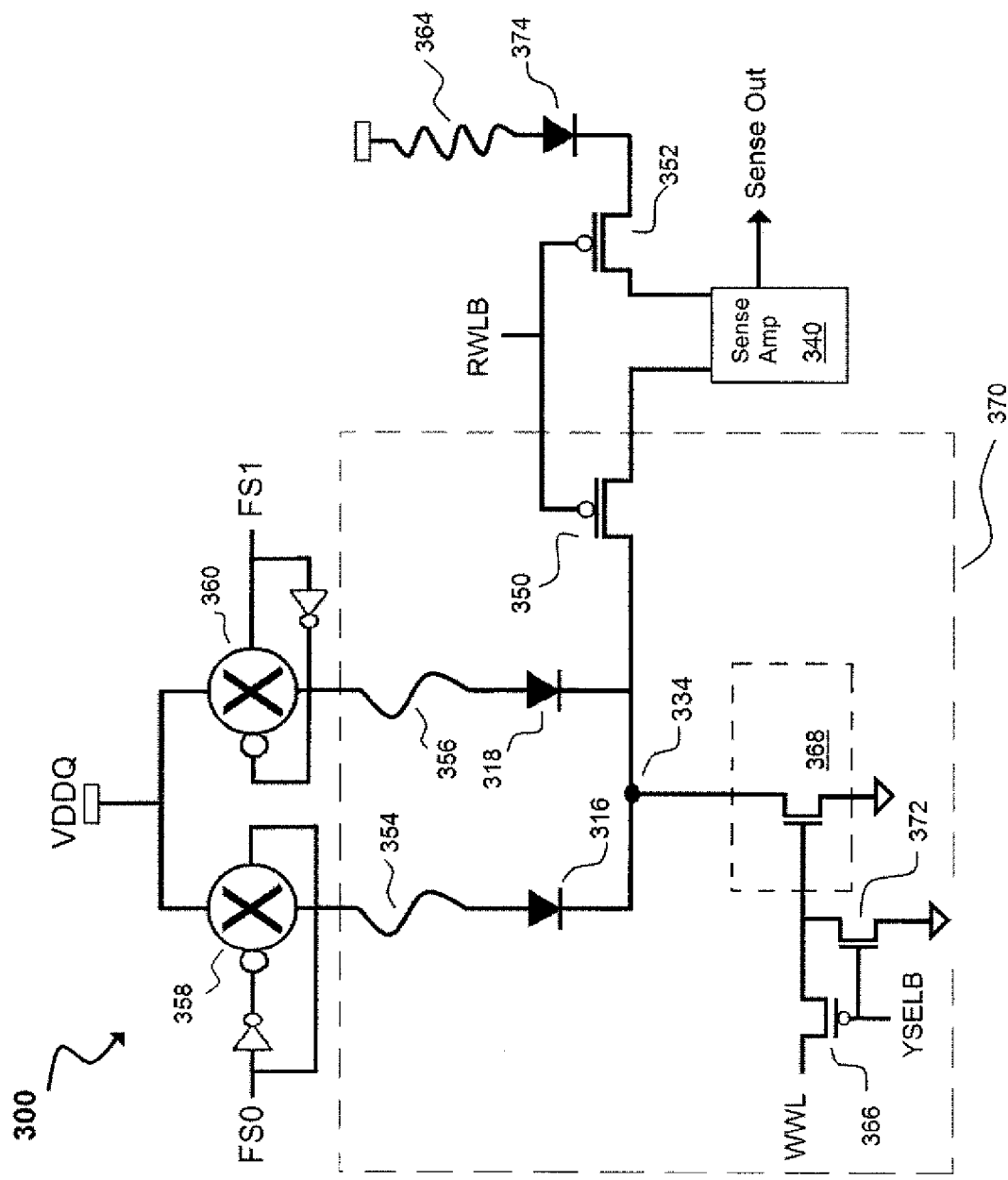
FIG. 3 illustrates a schematic of a fuse cell with circuitry to detect which fuse has been programmed.

FIG. 3 presents a schematic diagram 300 showing how two electrical fuses 354 and 356 share a single programming device 368 in accordance with one embodiment of the present invention. The fuse cell 370 is implemented with an input select device 366 and an output select device 350 to allow the construction of a one-or two-dimensional fuse array. The fuses 354 and 356 are connected to the programming device 368 through the diodes 316 and 318, respectively. The electrical fuses 354 and 356 are also connected to the high voltage source VDDQ through, respectively, multiplexers 358 and 360, which are controlled, respectively, by fuse signal lines FS0 and FS1. This embodiment includes a sense amplifier 340 for providing an output signal "Sense Out". The sense amplifier 340 is coupled to the fuse cell through the output select device 350 and to a reference resistor 364 through PMOS device 352 and diode 374. The signal RWLB controls the output select device 350 and PMOS device 352 to provide signals to the sense amplifier 340.

For example, when the electrical fuse 356 needs to be programmed, a Y-select line (YSELB) will provide a low signal to command the input select device 366 to turn on, thereby allowing a high input signal from a write wordline (WWL) to enter the programming device 368 and turning on, in this example, the NMOS transistor therein. The control signal from the fuse signal line FS1 will turn on the multiplexer 360, thereby allowing the high voltage source VDDQ to provide the current necessary for the programming device 368 to program the electrical fuse 356. The diode 316 acts to prevent current from interfering with the fuse 354. After programming the electrical fuse 356, the Y-select line YSELB is controlled to a high signal such that the input select device 366 is turned off and the NMOS transistor 372 is turned on. Turning on the NMOS transistor 372 provides a low signal to the programming device 368 ensuring that it is turned off.

In this embodiment it is also possible to read data by ensuring that the NMOS transistor in the programming device 368 is off and by inputting a low signal through a read wordline (RWLB) to turn on the output select device 350 and PMOS device 352. This can allow the signal (e.g., an electrical parameter value) at a node 334 to output to the sense amplifier 340, which detects very small changes in the voltage of bit lines relative to a pre-determined reference voltage provided through the PMOS device 352, the diode 374 and the reference resister 364. The sense amplifier 340 provides an output of data as a logic state "0" or "1". For example, if the electrical fuse 356, which is previously programmed, needs to be checked to ensure that it is properly programmed, the fuse select line FS1 can input a signal to turn on the multiplexer 360. Since the electrical fuse 356 has already been blown due to previous programming, the high voltage source VDDQ will be hard to reach the node 334. As such, the output from the sense amplifier 340 will have a low output. To check the electrical fuse 354, the fuse select line FS0 will need to input a signal to turn on the multiplexer 358. This allows the high voltage supply VDDQ to reach the node 334, thereby providing a high signal output from the fuse cell 370 through the PMOS device 350. In this example the diode 318 prevents the voltage at the node 334 from interfering with fuse 356.

While the electrical fuses 354 and 356 are shown to connect to the programming device 368 which contains an NMOS transistor, it is nevertheless understood by those skilled in the arts that that PMOS-type devices may also be used as a programming device for this invention, whereas input and output select devices 366 and 350 can also be NMOS-type, PMOS-type, or zero threshold transistors within the scope of this invention. Also those skilled in the arts will recognize that the diodes 316 and 318 can be any unidirectional current device such as NMOS-type or PMOS-type semiconductors having their gates connected to their drains such that they only allow a current to flow in a single direction. Also combinations of zero-Vt or low Vt MOS-type devices may be used to cause the same unidirectional current operation. FIG. 3 shows one embodiment of using one sensing device in one fuse cell.

Figure 4:
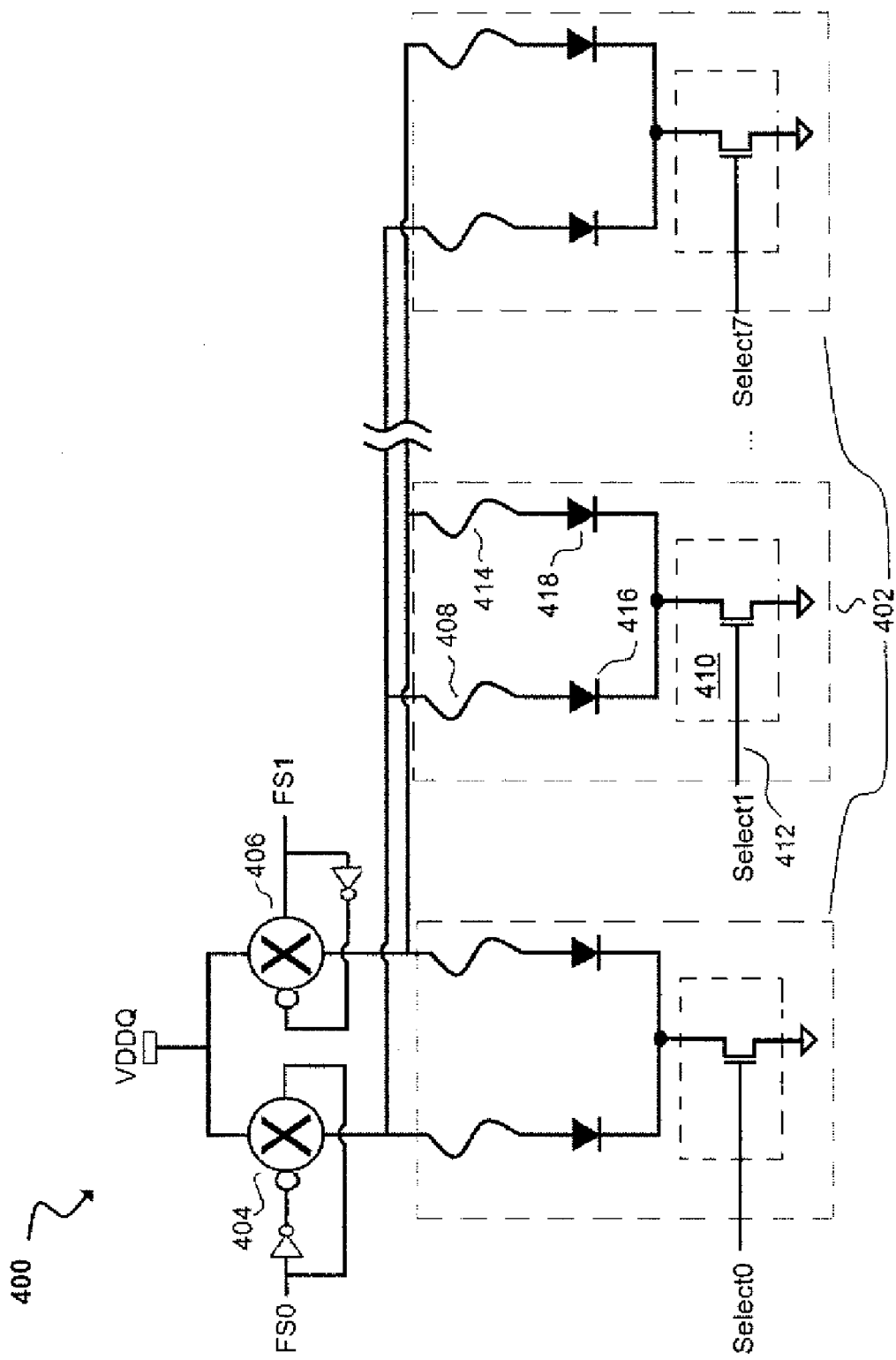
FIG. 4 illustrates a schematic for programming a fuse cell in an array of fuse cells.

FIG. 4 presents a schematic diagram 400 showing a one-dimensional array of 8 fuse cells 402 in accordance with another embodiment of the present invention. The fuse cell array is set up in an 8-by-1 configuration. The fuse cells 402 allow two electrical fuses to share one programming device. Each electrical fuse is connected to the high voltage source VDDQ through one of the multiplexers 404 or 406, which are respectively controlled by the fuse select lines FS0 and FS1. The fuse cell that needs to be programmed will be selected by "Select" signals 0 through 7. A select line is connected to each programming device within the array of fuse cells 402. The programming device 410 is coupled to the fuse 408 through diode 416 and to fuse 414 through diode 418. By selecting a certain select signal and opening the correct multiplexer, a predetermined electrical fuse can be programmed when the high voltage source VDDQ provides the necessary current for the programming device.

For example, if an electrical fuse 408 is to be programmed, a control signal will enter a programming device 410 through a select line 412 and command it to program the electrical fuse 408 by turning on, in this example, the NMOS transistor within the programming device 410. Incoming signals will also appear at the fuse select line FS0 commanding the multiplexer 404 to turn on. This opens up a path for the high voltage source VDDQ to provide the current necessary to break the electrical fuse 408. Diode 418 prevents the programming current from affecting fuse 414.

By implementing fuse cells where two electrical fuses share one program device, and one or more unidirectional current devices isolate the programming current, the number of available fuses is effectively doubled without wasting extra silicon area for a larger number of large programming devices. Note that fuse cells used in such array is merely an embodiment of this invention and it can vary since it is not limited to only two fuses per cell. For example a 4-to-1 selection module such as a 4-to-1 multiplexer can be used to select one of four fuses to be programmed at any time. As such, each fuse cell can have four fuses sharing one programming device. Similarly, an x-to-1 selection module combined with a programming device can control "x" number of fuses to be programmed wherein "x" is an integer or most likely an even integer.

Figure 5:
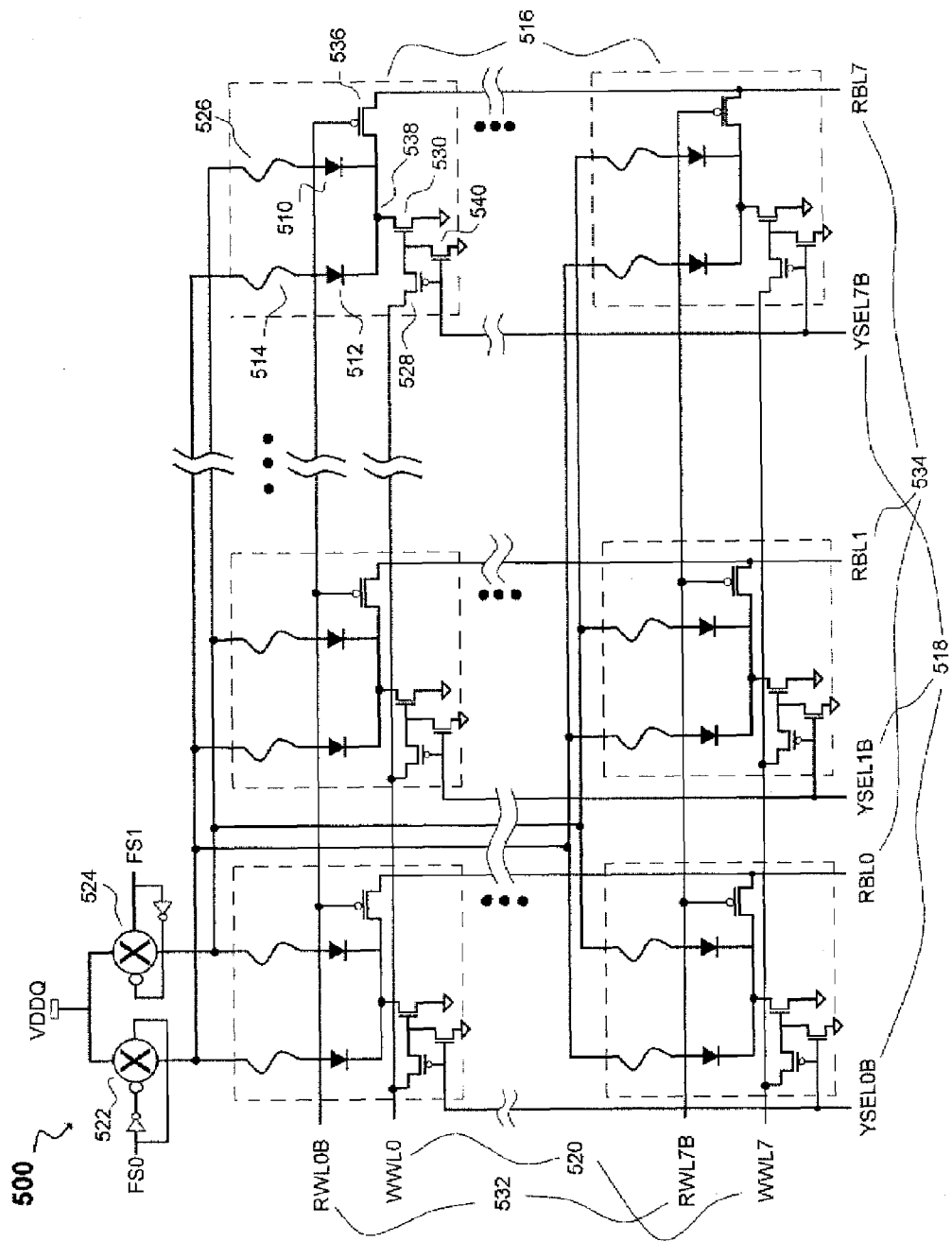
FIG. 5 illustrates a schematic of a multidimensional fuse cell array in accordance with one embodiment of the current invention.

FIG. 5 presents a schematic diagram 500 illustrating a two-dimensional array of 64 fuse cells 516 in accordance with yet another embodiment of the present invention. The array is set up in an 8-by-8 configuration. All 64 fuse cells are similar to the fuse cell 370 in FIG. 3, which allows two electrical fuses to share one programming device in each fuse cell. As shown, the 64 fuse cells are arranged in 8 rows and 8 columns. This two-dimensional array is controlled by various selection signals. With incoming signals from various Y-select lines (YSELBs) 518, various write wordlines (WWLs) 520, and fuse select lines FS0 and FS1, an exact electrical fuse can be located for programming. Signals from YSELBs 518 can determine the column location of the fuse cell that contains the electrical fuse that needs to be programmed, while signals from WWLs 520 can determine the row location. The fuse select lines FS0 and FS1 control if either the multiplexer 522 or 524 will turn on. With the exact fuse cell selected and the correct multiplexer turned on, a specific electrical fuse can be located for the programming process.

For example, if an electrical fuse 526 is to be programmed, a Y-select line YSEL7B will provide a low signal to turn on an input select device 528, thus allowing a high input signal from a write wordline (WWL0) to enter a programming device 530. Meanwhile, the control signal from the fuse signal line FS1 will turn on the multiplexer 524, thus allowing the high voltage source VDDQ to provide the current necessary for the programming device 530 to program the electrical fuse 526. While the current for programming electrical fuse 526 is applied to the cell, the diode 512 prevents a current from interfering with fuse 514.

Since the fuse cells 516 are implemented with both input and output select devices, it is possible to read the state of a certain fuse if the specific address of the fuse is provided. The RWLs 532 can provide a low signal to turn on the output select devices for a row of fuse cells 516. The YSELBs 518 will provide the column location of the certain electrical fuse.

With the row and the column location along with a proper signal from the fuse select lines FS0 or FS1, a specific electrical fuse can be precisely located for in a read operation. The results from this reading process may exit through various read bit lines (RBLs) 534.

If the previously programmed electrical fuse 526 is to be read for its state, the read wordline RWL0B will input a low signal, thereby turning on the output select devices of an entire row of the fuse cells 516, including the output select device 536. The Y-select line YSEL7B will assist in locating the specific fuse cell by providing the column address of the fuse cell. The fuse select line FS1 will also command the multiplexer 524 to turn on. Since the electrical fuse 526 has already been programmed due to previous programming, the high voltage supply VDDQ will be hard to reach a node 538. As such, a read bit line RBL7 will have a low output. The diode 512 prevents the high voltage supply VDDQ from interfering with fuse 514.

Figure 6:
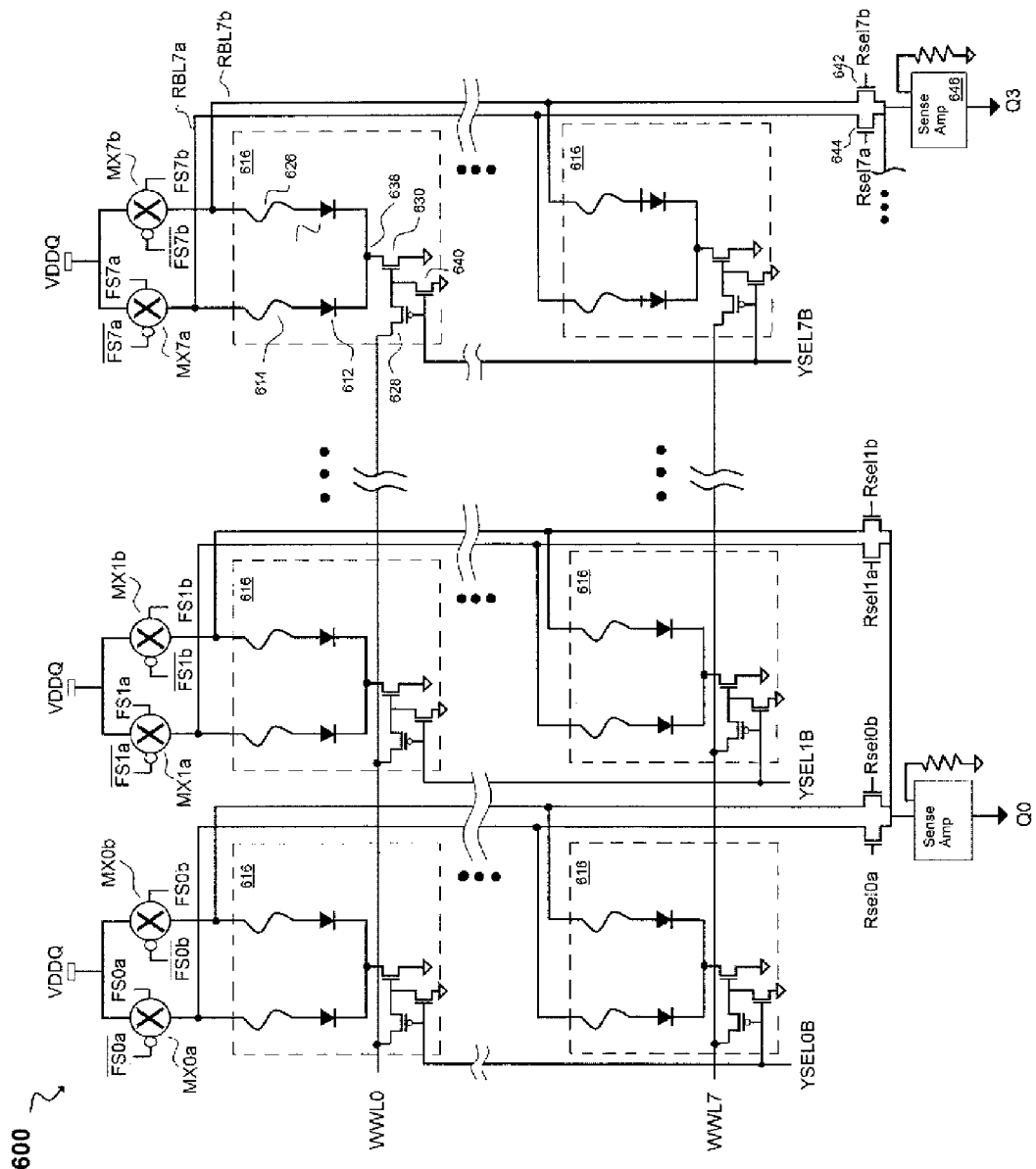
FIG. 6 illustrates a schematic of a multidimensional fuse cell array connected to sense amplifiers in accordance with another embodiment of the current invention.

FIG. 6 illustrates yet another embodiment of a two-dimensional fuse cell array in accordance with another embodiment of the current invention. The array is set up in an 8-by-8 configuration. All 64 fuse cells are similar to the fuse cell 370 in FIG. 3, which allows two electrical fuses to share one programming device in each fuse cell. As shown, the 64 fuse cells are arranged in 8 rows and 8 columns. This two-dimensional array is controlled by various selection signals. With incoming signals from various Y-select lines (YSEL0B-YSEL7B), various write wordlines (WWL0-WWL7) and fuse select lines (FS0a and FS0b-FS7a and FS7b), an exact electrical fuse can be located for programming. The Signals YSEL0B-YSEL7B can determine the column location of the fuse cell that contains the electrical fuse that needs to be programmed, while signals from write wordlines WWL0-WWL7 can determine the row location. The fuse select lines FS0a-FS7b control if either the multiplexers MX0a-MX7b will turn on. With the exact fuse cell selected and the correct multiplexer turned on, a specific electrical fuse can be located for the programming process.

For example, if an electrical fuse 626 is to be programmed, a Y-select line YSEL7B will provide a low signal to turn on an input select device 628, thus allowing a high input signal from a write wordline (WWL0) to enter a programming device 630. Meanwhile, the control signal from the fuse signal line FS1 will turn on the multiplexer MX7b, thus allowing the high voltage source VDDQ to provide the current necessary for the programming device 630 to program the electrical fuse 626. While the current for programming electrical fuse 626 is applied to the fuse cell, the diode 612 prevents a current from interfering with fuse 614. Once programming is complete, the YSEL7B signal returns to a high signal turning on NMOS device 640 such that a low signal is applied to the programming device 630 ensuring the programming device 630 is shut off.

Since the fuse cell 616 are implemented with both input and output select devices, it is possible to read the state of a certain fuse if the specific address of the fuse is provided. The read wordline WWL0-WWL7 and YSEL0B-YSEL7B can provide a low signal to turn on the select devices for a row of fuse cells. The read select lines Rsel0a-Rsel7b will provide the column location of the certain electrical fuse. With the row and the column location along with a proper signal from the fuse select lines FS0a to FS7b to turn off multiplexers MX0a-Mx1a, MX0b-MX1b, a specific electrical fuse can be precisely located for a read operation. The results from this reading process may be applied to various sense amplifiers, which amplify the signal present on the read line. The various sense amplifiers generate the signals Q1-Q3 which exit the circuit, thus each sense amplifier s is responsible to amplify 4 out of a total of 16 outputs.

If the previously programmed electrical fuse 626 is to be read for its state, the read wordline Rsel7*b* will input a high signal, thereby turning on the output select device 642. The Y-select line YSEL7B will assist in locating the specific fuse cell by providing the column address of the fuse cell. The fuse select line FS7*b* will also command the multiplexer MX7*b* to turn off. The signal on read bit line RBL7*b* is coupled to the sense amplifier 646 through the output select device 642. The sense amplifier 646 generates the signal Q3 which exits the circuit.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A fuse circuit comprising:
    one or more one-time programmable electrical fuses;
    one or more unidirectional conductive devices each coupled to one of the fuses;
    a MOS programming device coupled to the unidirectional conductive devices; and
    a selection module coupled to the electrical fuses for selecting a predetermined electrical fuse,
    wherein upon a selection by the selection module, a programming current is introduced through at least one selected electrical fuse, wherein the selection module is an N-to-one multiplexer selecting one of the N number of electrical fuses to be programmed, and the unidirectional conductive devices not coupled to the selected electrical fuse prevent the programming current from interfering with the remaining electrical fuses.

2. The fuse circuit of claim 1, wherein each unidirectional conductive device is a diode having an anode connected to the predetermined electrical fuse and a cathode connected to the programming device.

3. The fuse circuit of claim 1, wherein the unidirectional conductive device is a MOSFET having a gate terminal coupled to a drain terminal.

4. The fuse circuit of claim 1, wherein the selection module has one or more electrical fuse selection signals each allowing only one fuse to be coupled to the programming voltage.

5. The fuse circuit of claim 1, wherein the electrical fuses are silicided poly fuses.

6. The fuse circuit of claim 1, wherein the programming device is a MOS transistor with its gate controlled by a programming selection signal whose value decides whether the transistor is turned on or off.

7. The circuit of claim 6, further comprising:
    an input select device for providing the programming selection signal;
    an output select device for reading an electrical parameter value at one end of each fuse for detecting an electric parameter thereof; and
    a sensing device coupled to the output select device for comparing with a reference voltage for providing a logic state of a selected fuse by the selection module.

8. The circuit of claim 1, wherein the programming device is an NMOS transistor directly coupled to a complementary power supply at one end and the unidirectional conductive devices at its opposite end.

9. The circuit of claim 1, wherein the programming device is a PMOS transistor directly coupled to the programming voltage at one end and the unidirectional conductive devices at its opposite end.

10. The circuit of claim 1, wherein the unidirectional current device is a diode having an anode connected to the fuse and a cathode connected to the programming device.

11. The circuit of claim 10, wherein the diode is selected from a group consisting of a P/N junction diode, a zero-Vt MOS device having a gate terminal coupled to a drain terminal or a low-Vt MOS device having a gate terminal coupled to a drain terminal.

12. A fuse circuit comprising:
    one or more one-time programmable electrical fuses;
    one or more unidirectional conductive devices each coupled to one of the fuses;
    a MOS programming device coupled to the unidirectional conductive devices;
    a selection module coupled to the fuses for selecting a predetermined electrical fuse; and
    a sensing device for comparing with a reference device for providing a logic state of the predetermined electrical fuse if selected by the selection module in a reading operation,
    wherein upon a selection by the selection module in a writing operation, a programming current is introduced through the predetermined electrical fuse, wherein the selection module is an N-to-one multiplexer selecting one of the N number of electrical fuses.

13. The circuit of claim 12, wherein the selection module has one or more fuse selection signals each allowing only one fuse to be coupled to the programming voltage.

14. The circuit of claim 12, wherein the electrical fuses are silicided poly fuses.

15. The circuit of claim 12, wherein the programming device is a MOS transistor with its gate controlled by a programming selection signal whose value decides whether the transistor is turned on or off.

16. The circuit of claim 15, further comprising:
    an input select device for providing the programming selection signal; and
    an output select device coupled to the sensing device for selectively allowing the sensing device to access a predetermined end of the unidirectional conductive device.

17. The circuit of claim 12, wherein the unidirectional current device is a diode having an anode connected to the fuse and a cathode connected to the programming device.

18. The circuit of claim 17, wherein the diode is selected from a group consisting of a P/N junction diode, a zero-Vt MOS device having a gate terminal coupled to a drain terminal or a low-Vt MOS device having a gate terminal coupled to a drain terminal.

* * * * *